United States Patent [19]
Wakiya et al.

[11] Patent Number: 5,631,314
[45] Date of Patent: May 20, 1997

[54] LIQUID COATING COMPOSITION FOR USE IN FORMING PHOTORESIST COATING FILMS AND PHOTORESIST MATERIAL USING SAID COMPOSITION

[75] Inventors: Kazumasa Wakiya; Masakazu Kobayashi; Toshimasa Nakayama, all of Kanagawa-ken, Japan

[73] Assignee: Tokyo Ohka Kogyo Co., Ltd., Kanagawa-ken, Japan

[21] Appl. No.: 427,900

[22] Filed: Apr. 26, 1995

[30] Foreign Application Priority Data

Apr. 27, 1994 [JP] Japan ................... 6-110163

[51] Int. Cl.$^6$ .................. C08L 101/04; C08F 2/44
[52] U.S. Cl. ................ 524/165; 526/206; 526/214; 526/225; 526/236
[58] Field of Search ................... 526/206, 214, 526/225, 236

[56] References Cited

U.S. PATENT DOCUMENTS

| | | | |
|---|---|---|---|
| 4,293,657 | 10/1981 | Nissen et al. | 521/121 |
| 4,910,122 | 3/1990 | Arnold et al. | 430/313 |

FOREIGN PATENT DOCUMENTS

| | | |
|---|---|---|
| 0522990 | 1/1993 | European Pat. Off. . |
| 60-038821 | 2/1985 | Japan . |
| 62-062520 | 3/1987 | Japan . |
| 3222409 | 10/1991 | Japan . |
| 4-204454 | 7/1992 | Japan . |
| 6-051523 | 2/1994 | Japan . |
| 6-067439 | 3/1994 | Japan . |
| 6-069120 | 3/1994 | Japan . |

*Primary Examiner*—Joseph L. Schofer
*Assistant Examiner*—Wu C. Cheng
*Attorney, Agent, or Firm*—Wenderoth, Lind & Ponack

[57] ABSTRACT

A liquid coating composition for forming an anti-interference film over a photoresist film is prepared by combining a water-soluble, film-forming component with a specified fluorosurfactant or by combining said water-soluble, film-forming component with a fluoro-surfactant and a specified anionic surfactant. A coating film is formed from said liquid coating composition over a photoresist film to produce a photoresist material of a dual structure. The photoresist material is particularly effective in lessening the multiple-interference effect of light, thereby enabling the formation of very fine resist patterns having high fidelity to mask patterns.

18 Claims, 4 Drawing Sheets

LIQUID COATING COMPOSITION FOR USE IN FORMING PHOTORESIST COATING FILMS AND PHOTORESIST MATERIAL USING SAID COMPOSITION

BACKGROUND OF THE INVENTION

1. Field of the Invention

This invention relates to a novel liquid coating composition suitable for use in forming photoresist coating films, as well as a photoresist material using said composition. More specifically, the invention relates to a liquid coating composition for use in the photolithographic formation of a photoresist pattern to form an anti-interference film on a photoresist film which is capable of sufficiently reducing the multiple interference of light in the photo-resist film to lessen the chance of degradation in the dimensional precision of the photoresist pattern. The invention also relates to a photoresist material of a dual structure that comprises a photoresist film overlaid with an anti-interference film formed of said liquid coating composition.

2. Description of Relevant Art

Photolithography as employed in the fabrication of semiconductor devices comprises the steps of providing a photoresist film on a substrate such as a silicon wafer, selectively exposing it by illumination with an actinic radiation such as UV light, far UV light, excimer laser, X-rays or electron beams, and performing development to form a photoresist pattern on the substrate. Photo-resists are of two types. A negative-working photoresist is such that the unilluminated area is dissolved away during development, while a positive-working photoresist has the illuminated area dissolved away. Either type of photoresists are selectively used as appropriate for a specific object.

With the recent improvement in the degree of integration of semiconductor devices, R & D efforts are being directed to production equipment adapted for microelectronic fabrication technology. Under the circumstances, the use of exposing equipment that operates on single-wavelength actinic radiations such as g-line, i-line and excimer laser is increasing because of its compatibility with microelectronic fabrication technology.

In the formation of resist patterns by photolithography, incident light is known to undergo multiple interference in the photoresist film and this causes variations in the linewidth of resist patterns with varying thicknesses of the photoresist film. The cause of this multiple interference effect of light is as follows: illuminating light falling at a single wavelength on the photoresist film interferes with the reflected light from the underlying substrate so that the absorption of light energy varies with the thickness of the photoresist film. Hence, variations in the thickness of the photoresist film will adversely affect the linewidth of the developed resist pattern and eventually degrade its dimensional precision. When forming a fine pattern on a substrate having steps, this phenomenon presents an unavoidable serious problem since the thickness of the photoresist film inevitably differs at different heights of each step. Hence, it is desired to develop a technology that eliminates the multiple interference lithography, effect of light to insure that the dimensional precision of fine patterns will not be degraded even if they are formed on a substrate having steps.

It has heretofore been proposed that the multiple interference effect of light be lessened by forming an antireflective (anti-interference) film on a surface of a substrate (see U.S. Pat. No. 4,910,122) or by first forming a photoresist film on the substrate and then forming a film of a water-soluble resin (e. g. polysiloxane or polyvinyl alcohol) as an antireflective film over the photoresist film (see Japanese Patent Publication (KOKOKU) 4-55323, Japanese Patent Public Disclosure (KOKAI) 3-222409, etc.). The first approach is effective to some extent in lessening the multiple interference effect of light; however, if light having the same wavelength as exposing light is used in mask alignment, the antireflective film will attenuate the alignment detection signal, making it difficult to achive high alignment accuracy. Additionally, the resist has to be transferred patternwise and precisely onto the antireflective film, which must thereafter be etched or otherwise stripped away without affecting the device being fabricated. Since this increases unavoidably the number of process steps involved, the first approach which comprises forming the antireflective film on a surface of the substrate is not applicable to all cases of substrate processing. On the other hand, the second approach, which comprises forming an antireflective film on a photoresist film over the substrate, is practical since it does not require an intricate process. However, none of the anti-reflective films formed from the conventional liquid coating compositions have proved to be completely satisfactory in their anti-interference action. The slightest interference effect can influence significantly the dimensional precision of photoresist patterns if they are very fine and, hence, the anti-interference films available today are incapable of meeting the recent demand for smaller feature sizes in the fabrication of semiconductor devices. Under the circumstances, there is a strong need to develop a more effective anti-interference film.

Anti-interference films are conventionally formed by spin coating or otherwise applying liquid coating compositions onto the photoresist film and in order to prevent the corrosion of applicators and, related equipment, it has been desired to develop a liquid coating composition that permits final pH adjustment to neutrality. In this regard, EP 0522990 A1 has proposed an anti-reflective coating that comprises an aqueous processable, film-forming fluorine-containing composition. The patent teaches that a fluoro-carbon compound can be contained in the fluorine-containing composition and specific examples of this compound include perfluoroalkyl acids, perfluoroalkyl sulfonic acids, etc. in the form of salts such as ammonium and tetramethyl ammonium salts. However, liquid coating compositions containing these compounds are acidic (with pHs of about 2–4) and, hence, there is high likelihood that applicators and related equipment are corroded by acid. Attempts to bring the liquid coating composition to neutrality have been unsuccessful since those salts of fluorocarbon compounds either gel or become completely insoluble to form a precipitate. Hence, it is desired to develop a liquid coating compositions for forming Photoresist coating films that serve satisfactorily as antireflective films and that yet are capable of preventing the corrosion of applicators and related equipment.

For the purpose of lessening the chance of degradation in the dimensional precision of Photoresist patterns, reducing the multiple interference effect of light in the Photoresist film by coating it with an anti-interference film is not sufficient and it is also necessary that the anti-interference film be applied uniformly to eliminate any unevenness in deposit. In most cases, conventional liquid coating compositions that use a water-soluble, film-forming component and a fluorosurfactant are in effect composed of these two components only. However, if such two-component liquid coating compositions are applied onto photoresists to form anti-interference films, the resulting coating is poor in the uniformity of application and there is high likelihood for unevenness in deposit. If any uneven deposit occurs, the resulting resist pattern will be interrupted in the defective areas, thereby rendering it impossible to produce a resist pattern in good registry with the mask pattern.

The present inventors conducted intensive studies with a view to solving these problems of the prior art and found that their objective could be attained by either a liquid coating composition containing both a water-soluble, film-forming component and a fluorosurfactant having a specified chemical structure or a liquid coating composition containing said water-soluble, film-forming component, an unspecified fluorosurfactant, and an anionic surfactant having a specified chemical structure. Hence, by using a photoresist material of a dual structure that comprises a photoresist film overlaid with an anti-interference film formed from either of those liquid coating compositions, one can form a satisfactory resist pattern having high fidelity to a mask pattern.

SUMMARY OF THE INVENTION

An object of the invention is to provide a liquid coating composition suitable for use in forming a photoresist coating film that serves as a satisfactory anti-interference film to fully meet the recent demand for smaller feature sizes in the fabrication of semiconductor devices and which yet is capable of effective protection of applicators and related equipment against corrosion.

Another object of the invention is to provide a liquid coating composition that is suitable for use in forming a photoresist coating film because it insures uniformity in the coating operation to enable the formation of a coating film without uneven deposit, thereby permitting a resist pattern to be formed in good registry with a mask pattern.

Still another object of the invention is to provide a photoresist material of a dual structure that comprises a photoresist film overlaid with a coating film formed of one of the liquid coating compositions described above.

In its first aspect, the invention provides three liquid coating compositions for use in forming a photo-resist coating film and one of them (which is hereunder conveniently referred to as "the first liquid coating composition") comprises a water-soluble, film-forming component and at least one fluorosurfactant selected from among the salts of a compound represented by the following general formula (I):

RfCOOH    (I)

(where Rf is a fluorohydrocarbon group having part or all of the hydrogen atoms in a $C_2$–$C_{20}$ saturated or unsaturated hydrocarbon group replaced by fluorine atoms) with an alkanolamine and the salt of a compound represented by the following general formula (II):

R'fSO₃H    (II)

(where R'f is a fluorohydrocarbon group having part or all of the hydrogen atoms in a $C_2$–$C_{20}$ saturated or unsaturated hydrocarbon group replaced by fluorine atoms) with an alkanolamine.

Another liquid coating composition for use in forming a photoresist coating film (which is hereunder conveniently referred to as "the second liquid coating composition") comprises the above-mentioned water-soluble film-forming component, a fluorosurfactant, and at least one anionic surfactant represented by the following general formula (III):

(where $R_1$ is an alkyl or alkoxy group having 5 to 18 carbon atoms; $R_2$ is a hydrogen atom or an alkyl or alkoxy group having 5 to 18 carbon atoms; $R_3$ is an N-substituted or unsubstituted ammonium sulfonate group of the general formula

—SO₃NZ₄, each Z being, independently from the others, a hydrogen atom, alkyl group having 1 to 2 carbon atoms or hydroxy-alkyl group having 1 to 2 carbon atoms, and $R_4$ and $R_5$ are each a hydrogen atom or an N-substituted or unsubstituted ammonium sulfonate group of the general formula —SO₃NZ₄, Z having the same meaning as defined above).

The other liquid coating composition for use in forming a photoresist coating film (which is hereunder conveniently referred to as "the third liquid coating composition") is the same as the second liquid coating composition, except that it further contains an N-alkyl-2-pyrrolidone represented by the following general formula (VI):

(where $R_{10}$ is a $C_6$–$C_{20}$ alkyl group).

The photoresist material of a dual structure according to the second aspect of the invention comprises a photoresist film overlaid with a coating film formed of either one of the three liquid coating compositions defined above.

DETAILED DESCRIPTION OF THE INVENTION

The water-soluble, film-forming component contained in each of the three liquid coating compositions of the invention for use in forming photoresist coating films is not limited in any particular way and may be of any substance that is water-soluble and that transmits illuminating light. To mention a few characteristics that are preferably possessed by this component: (1) the ability to form a uniform film by conventional means of application such as spin coating; (2) applicability onto a photoresist film without forming an interfacial deteriorated layer; and (3) the ability to form highly transparent films of small absorption coefficient that transmit adequate amounts of actinic radiations.

Examples of the water-soluble, film-forming component that satisfy these requirements include: cellulosic polymers such as hydroxypropylmethyl cellulose phthalate, hydroxypropylmethyl cellulose acetate phthalate, hydroxypropylmethyl cellulose acetate succinate, hydroxypropylmethyl cellulose hexahydrophthalate, hydroxypropylmethyl cellulose, hydroxypropyl cellulose, hydroxyethyl cellulose, cellulose acetate hexahydrophthalate, carboxymethyl cellulose, ethyl cellulose and methyl cellulose; acrylic polymers having N,N-dimethylacrylamide, N,N-dimethylaminopropylmethacrylamide, N,N-dimethylaminopropylacrylamide, N-methylacrylamide, di-acetoneacrylamide, N,N-dimethylaminoethyl methacrylate, N,N-diethylaminoethyl methacrylate, N,N-dimethylaminoethyl acrylate, acryloylmorpholine, acrylic acid, etc. as monomer components; and vinyl polymers such as poly(vinyl alcohol) and poly(vinyl pyrrolidone). Among these, acrylic polymers, poly (vinyl pyrrolidone) and other water-soluble polymers having no hydroxyl groups in the molecule are preferred, with poly (vinyl pyrrolidone) being most preferred. The water-soluble, film-forming components listed above may be used either individually or in admixtures.

In addition to the water-soluble, film-forming component, the first liquid coating composition of the invention must contain as the second essential compound, at least one fluorosurfactant selected from among the salt of a compound of the above-defined general formula (I) with an alkanolamine and the salt of a compound of the above-defined general formula (II) with an alkanolamine.

Examples of the compound represented by the general formula (I) include perfluoroheptanoic acid and perfluorooctanoic acid. Examples of the compound represented by the general formula (II) include perfluoropropylsulfonic acid, perfluorooctylsulfonic acid and perfluorodecylsulfonic acid. Stated specifically, perfluoroheptanoic acid is commercially available as EF-201, etc. from Tohchem Products Co., Ltd. and perfluorooctylsulfonic acid as EF-101, etc. (also from Tohchem Products Co., Ltd.); these commercial products can be used with advantage. Among these, perfluorooctylsulfonic acid is particularly preferred for various reasons including high anti-interference effect, high solubility in water and ease in pH adjustment.

Exemplary alkanolamines include monoethanolamine, N-methyl ethanolamine, N-ethyl ethanolamine, diethanolamine and triethanolamine. Among these, monoethanolamine is used with particular advantage.

If either the salt of a compound of the general formula (I) with an alkanolamine or the salt of a compound of the general formula (II) with an alkanolamine or both are contained in the water-soluble, film-forming component, the pH of the photoresist coating solution to be finally prepared can be adjusted to neutrality. Since the coating solution will in no case turn acidic, applicators and related equipment can effectively be protected against corrosion.

The first liquid coating composition of the invention is typically used in the form of an aqueous solution. The content of the water-soluble, film-forming component ranges preferably from 0.5 to 10.0 wt %. Either the salt of a compound of the general formula (I) with an alkanolamine or the salt of a compound of the general formula (II) with an alkanolamine or both are preferably contained in an amount of 1.0–15.0 wt %.

As Just described above, the first liquid coating composition of the invention is typically used in the form of an aqueous solution. It should, however, be noted that if the composition additionally contains an alcoholic organic solvent such as isopropyl alcohol, the solubility of the fluorosurfactant increases to further improve the uniformity of coating application. Hence, alcoholic organic solvents may be incorporated in the first liquid coating composition as required. The addition of alcoholic organic solvents, if used at all, is preferably selected from the range up to 20 wt % of the total amount of the coating solution. It should also be noted that various additives for providing the coating film with improved characteristics may optionally be incorporated in the first liquid coating composition to such an extent that the objects of the invention will not be impaired.

The second liquid coating composition of the invention is the same as the first liquid coating solution, except that in addition to the water-soluble, film-forming component, it contains a fluorosurfactant and at least one anionic surfactant represented by the general formula (III) as essential components.

While the fluorosurfactant is not limited to any particular type and conventional fluorosurfactants may broadly be used, those which are anionic and which are based on nonmetallic ions can be used with particular advantage. Such anionic and nonmetallic ion based fluorosurfactants contain either a fluorine atom containing compound represented by the general formula (IV):

$$RfCOOM_1 \qquad (IV)$$

[where Rf is a fluorohydrocarbon group having part or all of the hydrogen atoms in a $C_2$–$C_{20}$ saturated or unsaturated hydrocarbon group replaced by fluorine atoms; $M_1$ is a hydrogen atom or $NR_5$, $R_7$, $R_8$, $R_9$ (where $R_6$, $R_7$, $R_8$ and $R_9$ are each independently a hydrogen atom or a lower alkyl group having 1 to 4 carbon atoms optionally having a hydroxyl group)] or fluorine atom containing compound represented by the general formula (V):

$$R'fSO_3M_2 \qquad (V)$$

[where R'f is a fluorohydrocarbon group having part or all of the hydrogen atoms in a $C_2$–$C_{20}$ saturated or unsaturated hydrocarbon group replaced by fluorine atoms; $M_2$ is a hydrogen atom or $NR_6$, $R_7$, $R_8$, $R_9$ (where $R_6$, $R_7$, $R_8$ and $R_9$ are each independently a hydrogen atom or a lower alkyl group having 1 to 4 carbon atoms optionally having a hydroxyl group)].

Examples of the fluorine atom containing compounds represented by the general formulae (IV) and (V) include perfluoropropylsulfonic acid, perfluoroheptanoic acid, perfluorooctanoic acid, perfluorooctylsulfonic acid, perfluorodecylsulfonic acid, ammonium perfluoroheptanoate, ammonium perfluorooctanoate, ammonium perfluorooctylsulfonate, tetramethylammonium perfluoropropylsulfonate, tetramethylammonium perfluoroheptanoate, tetramethylammonium perfluorooctylsulfonate, tetramethylammonium perfluorodecylsulfonate, monoethanol amine salt of perfluoropropylsulfonic acid, monoethanol amine salt of perfluorooctanoic acid, monoethanol amine salt of perfluorooctylsulfonic acid, and monoethanol amine salt of perfluorodecylsulfonic acid. Stated specifically, ammonium perfluorooctylsulfonate is commercially available as EF-104, Fc-93, etc., ammonium perfluoroheptanoate as EF-204, Fc-143, etc., and ammonium perfluorodecylsulfonate as Fc-120, etc. EF-104 and EF-204 are trade names of Tohchem Products Co., Ltd. whereas Fc-93, Fc-143 and Fc-120 are trade names of Sumitomo 3M, Ltd. The fluorine atom containing compounds of the general formulae (IV)

and (V) may be in the form of those commercial products or, alternatively, they may be readily formulated by the skilled artisan for use in the invention.

Among the fluorine atom containing compounds listed above, the salts of compounds of the general formula (I) (Rf has the same meaning as already defined) with alkanolamines, as well as the salts of compounds of the general formula (II) (R'f has the same meaning as already defined) with alkanolamines are particularly preferred since they are effective in protecting applicators and related equipment against corrosion. Hence, at least one compound selected from among these salts can also be incorporated with advantage in the second liquid coating composition of the invention. The compounds of the general formulae (I) and (II) may be illustrated by the same examples as those given in the description of the first liquid coating composition and Perfluorooctylsulfonic acid is particularly preferred for various reasons including high anti-interference effect, high solubility in water and ease in pH adjustment. Alkanolamines may also be illustrated by the same examples as those given in the description of the first liquid coating composition and monoethanolamine is used with particular advantage. There is no particular limitation on the alkanolamines that can be used in the invention.

The anionic surfactant is selected from among diphenyl ether derivatives represented by the general formula (III) ($R_1$, $R_2$, $R_3$, $R_4$ and $R_5$ have the same meanings as already defined).

The anionic surfactant of the general formula (III) may specifically be exemplified by, but not limited to, ammonium alkyldiphenylether sulfonate, tetramethyl ammonium alkyldiphenylether sulfonate, trimethylethanolammonium alkyldiphenylether sulfonate, triethylammonium alkyldiphenylether sulfonate, ammonium alkyldiphenylether disulfonate, diethanolammonium alkyldiphenylether disulfonate and tetramethylammonium alkyldiphenylether disulfonate. The alkyl groups in the compounds listed above have 5–18 carbon atoms and may be replaced by alkoxy groups having 5–18 carbon atoms. These compounds may specifically be exemplified by the following general formulae (VII)–(XIX) which are given here for illustrative purposes only:

(VII)

(VIII)

(IX)

(X)

(XI)

(XII)

(XIII)

(XIV)

(XV)

(XVI)

(XVII)

(XVIII)

(XIX)

Among the anionic surfactants represented by the general formula (III), ammonium alkyldiphenylether disulfonate where $R_1$ is a $C_5$–$C_{18}$ alkyl, $R_2$ is a hydrogen atom, $R_3$ and $R_4$ each are —$SO_3NH_4$, and $R_5$ is a hydrogen atom in the general formula(III) is the preferred, with the ones represented by the general formula (XII) being more preferred. The above-listed anionic surfactants may be used either individually or in admixture.

If the above-described water-soluble, film-forming component and fluorosurfactant are combined with the anionic surfactant of the general formula (III) to formulate a liquid coating composition, the intended anti-interference film can be deposited uniformly in a more effective way without experiencing unevenness in application and a resist pattern can subsequently be formed in good registry with a mask pattern.

The second liquid coating composition of the invention thus prepared of the invention is typically used in the form of an aqueous solution. The content of the water-soluble, film-forming component ranges preferably from 0.5 to 10.0 wt %, and the content of the fluorosurfactant ranges preferably from 1.0 to 15.0 wt %. The anionic surfactant of the general formula (III) is generally added in an amount of 500–10,000 ppm, preferably from 1,000 to 5,000 ppm, with respect to the resist coating solution having the water-soluble, film-forming component and the fluorosurfactant being dissolved therein.

The third liquid coating composition of the invention is the same as the second liquid coating composition, except that it further contains an N-alkyl-2-pyrrolidone represented by the following general formula (VI):

(VI)

(where $R_{10}$ is $C_6$–$C_{20}$ alkyl group). The third liquid coating composition is particularly preferred since it has better applicability and need be applied in only a small amount to produce a uniform coat over the substrate from end to end.

Specific examples of the compound represented by the general formula (VI) include: N-hexyl-2-pyrrolidone, N-heptyl-2-pyrrolidone, N-octyl-2-pyrrolidone, N-nonyl-2-pyrrollidone, N-decyl-2-pyrrolidone, N-undecyl-2-pyrrolidon, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone and N-octadecyl-2-pyrrolidone. Among these, N-octyl-2-pyrrolidone and N-dodecyl-2-pyrrolidone are preferred since they are readily available as commercial products from ISP Japan Co., Ltd. under the trade names "SURFADONE LP100" and "SURFADONE LP300", respectively.

The compounds listed above are generally added in amounts ranging from 100 to 10,000 ppm, preferably from 150 to 5,000 ppm, with respect to the liquid coating composition having the water-soluble, film-forming component and the fluorosurfactant dissolved therein.

As already described, the second liquid coating composition of the invention is typically used in the form of an aqueous solution (this is also true with the third liquid coating composition). It should, however, be noted that if the second or third composition additionally contains an alcoholic organic solvent such as isopropyl alcohol, the solubility of the fluorosurfactant increases to further improve the uniformity of coating application. Hence, alcoholic organic solvents may be incorporated in the second or third liquid coating composition as required. The addition of alcoholic organic solvents, if used at all, is preferably selected from the range of up to 20 wt % of the total amount of the coating solution. It should also be noted that various additives for providing the coating film with improved characteristics may optimally be incorporated in the second or third liquid coating composition to such an extent that the objects of the invention will not be impaired.

The photoresists material according to the second aspect of the invention is a dual structure comprising a photoresist film overlaid with an anti-interference film formed from either the first, second or third liquid coating composition which have been described in the foregoing description. The resist composition for use in this photoresist material is not limited in any particular way and may be selected from among those which are in common use. While either positive- or negative-working photoresists may be used, those which comprise a light-sensitive material and a film-forming material and which are developable with aqueous alkalies are advantageous.

Particularly advantageous photoresist compositions are positive- and negative-working photoresist compositions having requisite characteristics that are well compatible with the recent microelectronic fabrication technology. Positive photoresist compositions may comprise quinonediazide-base light-sensitive materials and film-forming materials.

Exemplary quinonediazide-base light-sensitive materials are quinonediazide group containing compounds such as quinonediazides (e.g. orthobenzoquinonediazide, orthonaphthoquinodiazide and orthoanthraquinonediazide) in sulfonate form that are subjected to partial or complete esterification or amidation with compounds having a phenolic hydroxyl group or an amino group. Exemplary compounds having phenolic hydroxyl group or an amino group include: polyhydroxybenzophenones such as 2,3,4-trihydroxybenzophenone, 2,3,4,4'-tetrahydroxybenzophenone and 2,2',4,4'-tetrahydroxybenzophenone; as well as allyl gallate, phenol, p-methoxy-phenol dimethylphenol, hydroquinone, bisphenol A, naphthol, pyrocatechol, pyrogallol, pyrogallol monomethyl ether, pyrogallol-1,3-dimethyl ether, gallic acid, esterified or etherified gallic acid with some of the hydroxyl groups left intact, aniline and p-aminodiphenylamine. Particularly preferred quinonediazido group containing compounds are polyhydroxybenzophenone that has been completely or partially esterified with naphthoquinone-1,2-diazido-5-sulfonyl chloride or naphthoquinone-1,2-diazido-4-sulfonyl chloride.

Effective film-forming materials include; novolak resins produced by reacting phenol, cresol, xylenol, etc. with aldehydes; acrylic resins; and alkali-soluble resins such as styrene-acrylic acid copolymer, hydroxystyrene homopolymers, poly(vinyl hydroxybenzoate) and poly(vinyl hydroxybenzal). Particularly preferred positive-working photoresists are such that novolak resins synthesized from aldehydes and cresol or xylenol taken either alone or in admixture are used as film-forming materials. Their weight-average molecular weight with the lower molecular weight range being cut off ranges generally from 2,000 to 20,000, preferably from 5,000 to 15,000. In such positive-working photoresists compositions, the light-sensitive materials described above are incorporated in amounts of 10–40 parts by weight, preferably 15–30 parts by weight, per 100 parts by weight of the film-forming material.

Other positive-working photoresist compositions that can be used in the invention are chemically amplified photoresist compositions which become more alkali-soluble under the catalytic action of acids that are generated upon exposure.

The negative-working photoresist composition also is not limited in any particular way and any of the conventionally known negative-working photoresist compositions are applicable. Particularly preferred are chemically amplified negative-working photoresist compositions that comprise three components(i.e., binder, acid generator and base polymer) and which are suitable for the formation of fine patterns.

The method of preparing and using the photoresist material according to the second aspect of the invention will now be described with reference to an example. First, a photoresist film is formed on a substrate such as a silicon wafer in the usual manner. Thereafter, the first, second or third liquid coating composition of the invention is applied onto the photoresist film by spin coating. Then, the applied composition is heated to form an anti-interference coating film over the resist film to prepare the photo-resist material of a dual structure. Heating of the applied composition may be omitted if its application is sufficient to form a highly uniform coat of satisfactory quality.

In the next exposure step, an actinic radiation such as UV light or far UV light (including an excimer laser) is selectively applied to the photoresist film through the anti-interference film, followed by development to form a resist pattern on the silicon wafer.

The anti-interference film has an optimal thickness for effective reduction of the interference effect of actinic radiations. The optimal thickness is an odd multiple of $\lambda/4$ n ($\lambda$, the wavelength of the actinic radiation used; n, the refractive index of the anti-interference film). If the anti-interference has a refractive index of 1.41, its optimal thickness is an odd multiple of 77 nm for the g-lineband of UV light, an odd multiple of 65 nm for the i-line band of UV light, an odd multiple of 44 nm for far UV light (excimer laser). In practical applications, the thickness of the anti-interference film is preferably within ±5 nm of each value of the optimal thickness.

The anti-interference film is preferably formed over the chemically amplified, negative- or positive-working photoresist composition because it offers not only the anti-interference effect but also proves effective in improving the resist pattern profile. In semiconductor fabrication, chemically amplified photoresist compositions are subject to the action of the vapor of organic alkalies in ambient atmosphere, such as N-methyl-2-pyrrolidone, ammonia, pyridine and triethylamine, and acid deficiency will occur on the surface of the photoresist film. If this is the case, the resist pattern tends to have a round top (when the photoresist composition is of a negative type) or adjacent lines of the pattern may bridge to produce a visible flaw (if the photoresist composition is positive). The improvement in the resist pattern profile means eliminating these defects to guarantee the formation of a rectangular pattern profiles. Thus, the anti-interference film formed in accordance with the invention can also be used with advantages as a protective film for the chemically amplified photoresist compositions.

The anti-interference film may be removed at the time when the photoresist film is developed; however, in order to assure its complete removal, the anti-interference film is preferably stripped before development of the resist film. A typical method of stripping the anti-interference film is by spraying the rotating silicon wafer on a spinner with a solvent that selectively dissolves away the anti-interference film. An applicable solvent for removing the anti-interference film is an aqueous solution incorporating a surfactant.

The following examples are provided for the purpose of further illustrating the present invention but are in no way to be taken as limiting.

EXAMPLE 1

A positive photoresist (THMR-iP3000 of Tokyo Ohka Kogyo Co., Ltd.) comprising a cresol-novolak resin and a naphthoquinone diazide compound was applied onto eight 6-inch silicon wafers spinning at varied speeds. Subsequent drying on a hot plate at 90° C. for 90 sec produced photoresist films in varying thickness of 1.19–1.31 µm on the silicon wafers.

In a separate step, a 20 wt % aqueous solution(500 g) of perfluorooctylsulfonic acid ($C_8F_{17}SO_3H$; EF-101 of Tohchem Products Co., Ltd.) was mixed with a 20 wt % aqueous solution (80 g) of monoethanolamine. The mixed solution(25 g) was added to a 10 wt % aqueous solution(20 g) of poly(vinyl pyrrolidone). Pure water was added to the resulting aqueous solution to make a total of 200 g. The thus prepared liquid coating composition had a pH of 7.0.

Subsequently, the liquid coating composition was applied onto the photoresist film on each of the eight silicon wafers and dried at 90° C. for 90 sec to form anti-interference films in thicknesses of about 65 nm. There-after, a minifying projection exposure machine (NSR-1755i7A of Nikon Corp.) was used for exposure to the i-line through a mask pattern and the thus exposed resist films were bake-cured on a hot plate at 110° C. for 90 sec before they were processed by puddle development with a 2.38 wt % aqueous solution of tetramethyl ammonium hydroxide (TMAH) at 23° C. for 65 sec. The developed resist films were washed with pure water for 30 sec to form resist patterns.

Figure 1:
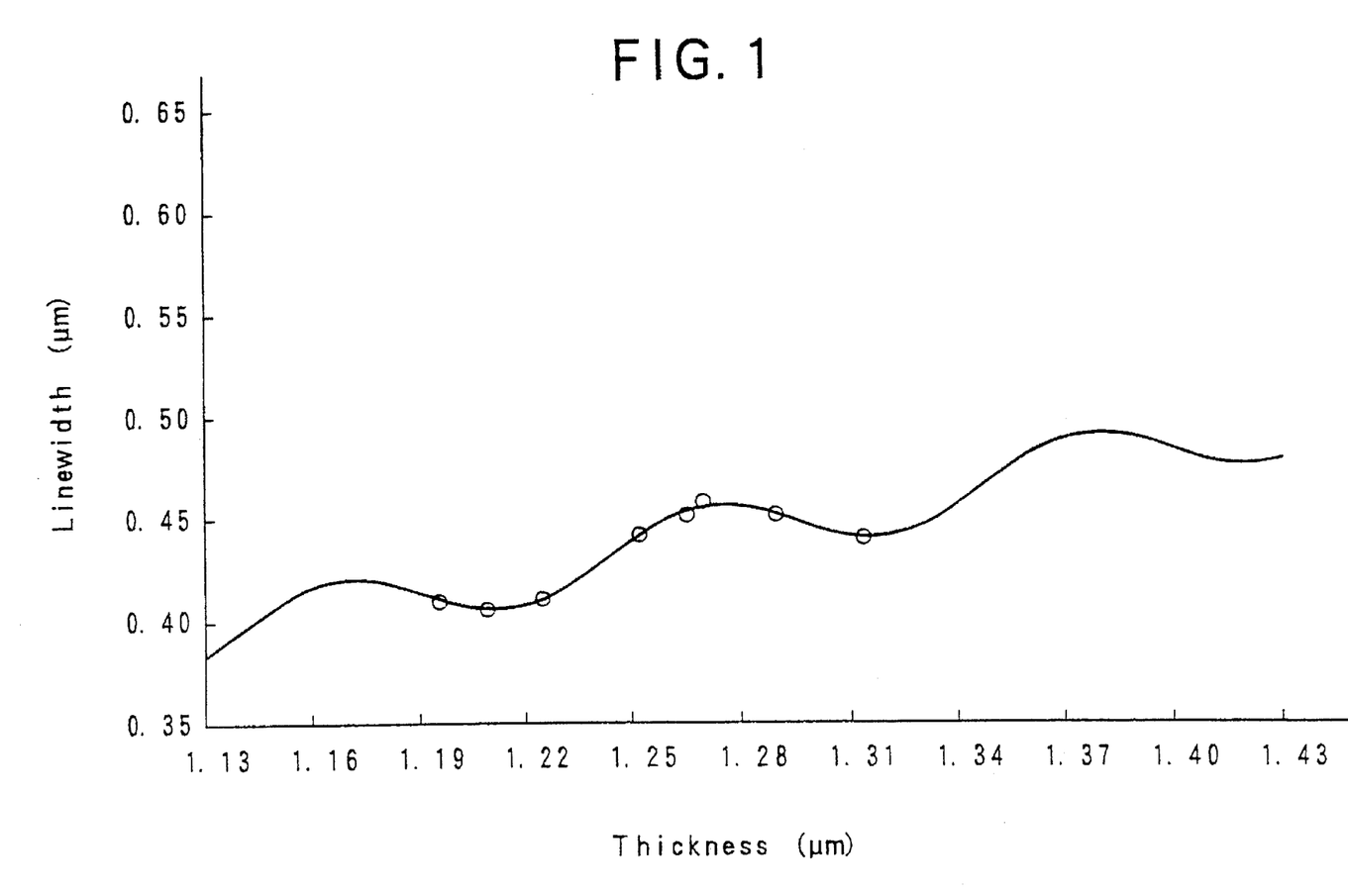
FIG. 1 is a graph showing the relationship between the thickness of the photoresist films prepared in Example 1 and the variations in the linewidth of the resist patterns.

The linewidth (0.45 µm) of the resist patterns formed on the eight Si wafers after exposure to equal amounts of light was measured as relative to the thickness of the photoresist films. The results are shown in the FIG. 1 graph by plotting the variations in the linewidth of the pattern on the y-axis while plotting the resist film thickness on the x-axis. Obviously, the maximum dimensional variation that occurred was 0.035 µm.

COMPARATIVE EXAMPLE 1

A 20 wt % aqueous solution (500 g) of perfluorooctylsulfonic acid($C_8F_{17}SO_3H$; EF-101 of Tohchem Products Co., Ltd.) was mixed with a 20 wt % aqueous solution (17 g) The resulting salt precipitated to prevent the preparation of an applicable liquid coating composition. The solution had a pH of 6.8.

COMPARATIVE EXAMPLE 2

A 20 wt % aqueous solution (500 g) of perfluorooctylsulfonic acid ($C_8F_{17}SO_3H$; EF-101 of Tohchem Products Co., Ltd.) was mixed with a 20 wt % aqueous solution (90g) of TMAH. The resulting salt precipitated to prevent the preparation of an applicable liquid coating composition. The solution had a pH of 6.5.

EXAMPLE 2

A positive-working photoresist (THMR-iP3000 of Tokyo Ohka Kogyo Co., Ltd.) comprising a cresol-novolak resin and a naphthoquinone diazide compound was applied onto eight 6-inch silicon wafers spinning at varied speeds. Subsequent drying on a hot plate at 90° C. for 90 sec produced photo-resist films in varying thicknesses of 1.19–1.31 µm on the silicon wafers.

In a separate step, a 20 wt % aqueous solution (500 g) of perfluorooctylsulfonic acid ($C_8F_{17}SO_3H$; EF-101 of Tohchem Products Co., Ltd.) was mixed with a 20 wt % aqueous solution (80 g) of monoethanolamine. The mixed solution (25 g) was added to a 10 wt % aqueous solution (20 g) of Poly(vinyl pyrrolidone). Pure water was added to the resulting aqueous solution to make a total of 200 g. To prepare a liquid coating composition from the aqueous solution, an anionic surfactant (PIONIN A-43N of Takemoro Oil & Fat Co., Ltd.) which was represented by the following general formula (XII):

was added in an amount of 1000 ppm. The composition had a pH of 6.8.

Subsequently, the liquid coating composition was applied onto the photoresist film on each of the eight silicon wafers and dried at 90° C. for 90 sec to form anti-interference films in thicknesses of about 65 nm. There-after, a minifying projection exposure machine (NSR-1755i7A of Nikon Corp.) was used for exposure to the i-line through a mask pattern and the thus exposed resist films were bake-cured on a hot plate at 110° C. for 90 sec before they were processed by puddle development with a 2.38 wt % aqueous solution of TMAH at 23° C. for 65 sec. The developed photo-resist films were washed with pure water for 30 sec to form resist patterns.

Figure 2:
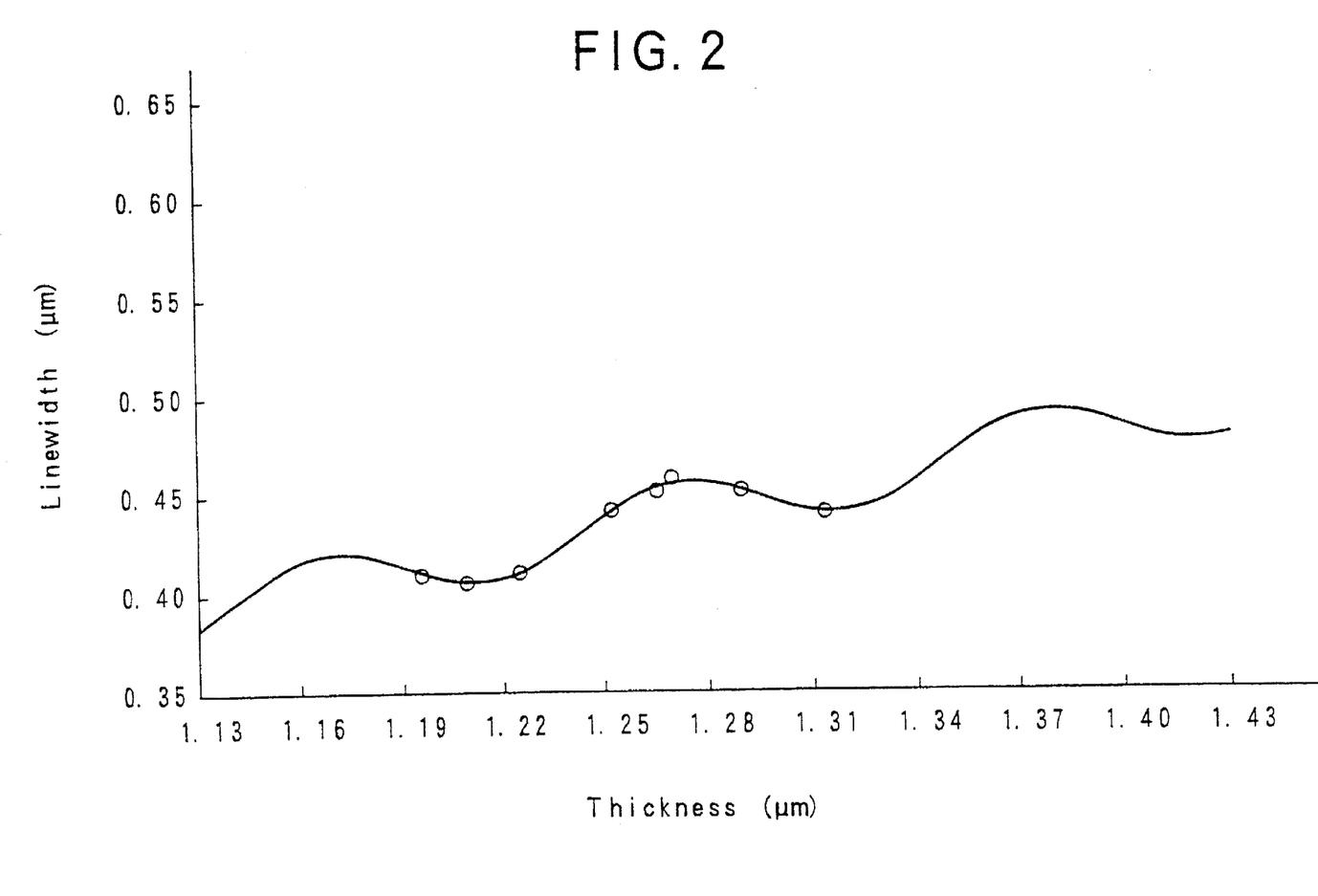
FIG. 2 is a graph showing the relationship between the thickness of the photoresist films prepared in Example 2 and the variations in the linewidth of the resist patterns.

The linewidth (0.45 µm) of the resist patterns formed on the eight Si wafers after exposure to equal amounts of light was measured as relative to the thickness of the photoresist films. The results are shown in the FIG. 2 graph by plotting the variations in the linewidth of the pattern on the y-axis while plotting the resist film thickness on the x-axis. Obviously, the maximum dimensional variation that occurred was 0.035 µm.

The surface of the anti-interference film formed on the photoresist film on each of the silicon wafers was examined with an optical microscope but there were found no areas where the liquid coating composition was applied unevenly. Scanning electron microscope (SEM) photography of the resist patterns showed that they were of satisfactory quality with high fidelity to the mask pattern.

COMPARATIVE EXAMPLE 3

A liquid coating composition was prepared by repeating the procedure of Example 2 except that PIONIN A-43N (anionic surfactant of Takemoto Oil & Fat Co., Ltd.) was not used. Photoresist films and resist patterns were formed by repeating the procedure of Example 2. When the linewidth (0.45 µm) of the resist patterns was measured as relative to the thickness of the photoresist films, the result was the same as in Example 2 (FIG. 2) and the maximum dimensional variation that occurred was about 0.035 μm.

However, when the surface of the anti-interference film formed on the photoresist film on each of the silicon wafers was examined with an optical microscope, there were found several areas where the liquid coating composition was applied unevenly. Additionally, SEM photography of the resist patterns showed occasional interruptions.

EXAMPLE 3

A positive photoresist (THMR-iP3300 of Tokyo Ohka Kogyo Co., Ltd.) comprising a cresol-novolak resin and a naphthoquinone diazide compound was applied onto twelve 6-inch silicon wafers spinning at varied speeds. Subsequent drying on a hot plate at 90° C. for 90 sec produced photo-resist films in varying thicknesses of 0.96–1.09 μm on the silicon wafers.

In a separate step, a 20 wt % aqueous solution (500 g) of perfluorooctylsulfonic acid ($C_8F_{17}SO_3H$; EF-101 of Tohchem Products Co., Ltd.) was mixed with a 20 wt % aqueous solution (80 g) of monoethanolamine. The mixed solution (30 g) was added to a 20 wt % aqueous solution (10 g) of poly(vinyl pyrrolidone). Pure water was added to the resulting aqueous solution to make a total of 200 g. To prepare a liquid coating composition from the aqueous solution, an anionic surfactant (PIONIN A-43N of Takemoro Oil & Fat Co., Ltd.) which was represented by the general formula (XII) was added in an amount of 800 ppm. Further, "SURFADONE LP100" of ISP Japan Co., Ltd. which was N-octyl-2-pyrrolidone represented by the following chemical formula (XX):

(XX)

was added in an amount of 500 ppm. The thus prepared liquid coating composition had a pH of 6.7.

Subsequently, the liquid coating composition was applied onto the photoresist film on each of the 12 silicon wafers, whereupon anti-interference films formed in thicknesses of 65 nm. Thereafter, a minifying projection exposure machine (NSR-1755i110D of Nikon Corp.) was used for exposure to the i-line through a mask pattern and the thus exposed photoresist films were bake-cured on a hot plate at 110° C. for 90 sec before they were processed by puddle development with a 2.38 wt % aqueous solution of TMAH at 23° C. for 65 sec. The developed photoresist films were washed with pure water for 30 sec to form resist patterns.

Figure 3:
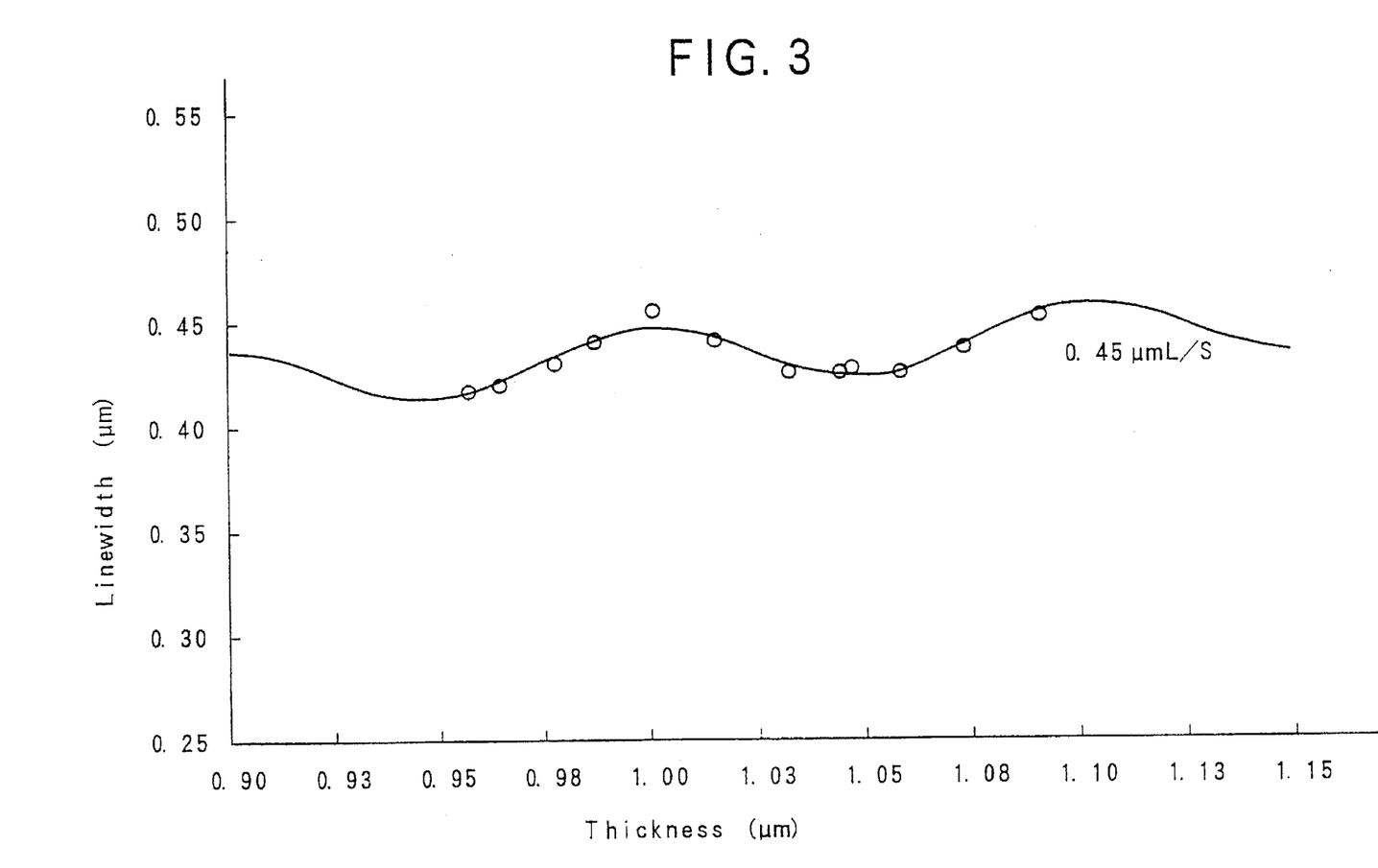
FIG. 3 is a graph showing the relationship between the thickness of the photoresist films prepared in Example 3 and the variations in the linewidth of the resist patterns.

The linewidth (0.45 μm) of the resist patterns formed on the 12 Si wafers after exposure to equal amounts of light was measured as relative to the thickness of the photoresist films. The results are shown in the FIG. 3 graph by plotting the variations in the linewidth of the pattern on the y-axis while plotting the resist film thickness on the x-axis. Obviously, the maximum dimensional variation that occurred was 0.027 μm.

Figure 4:
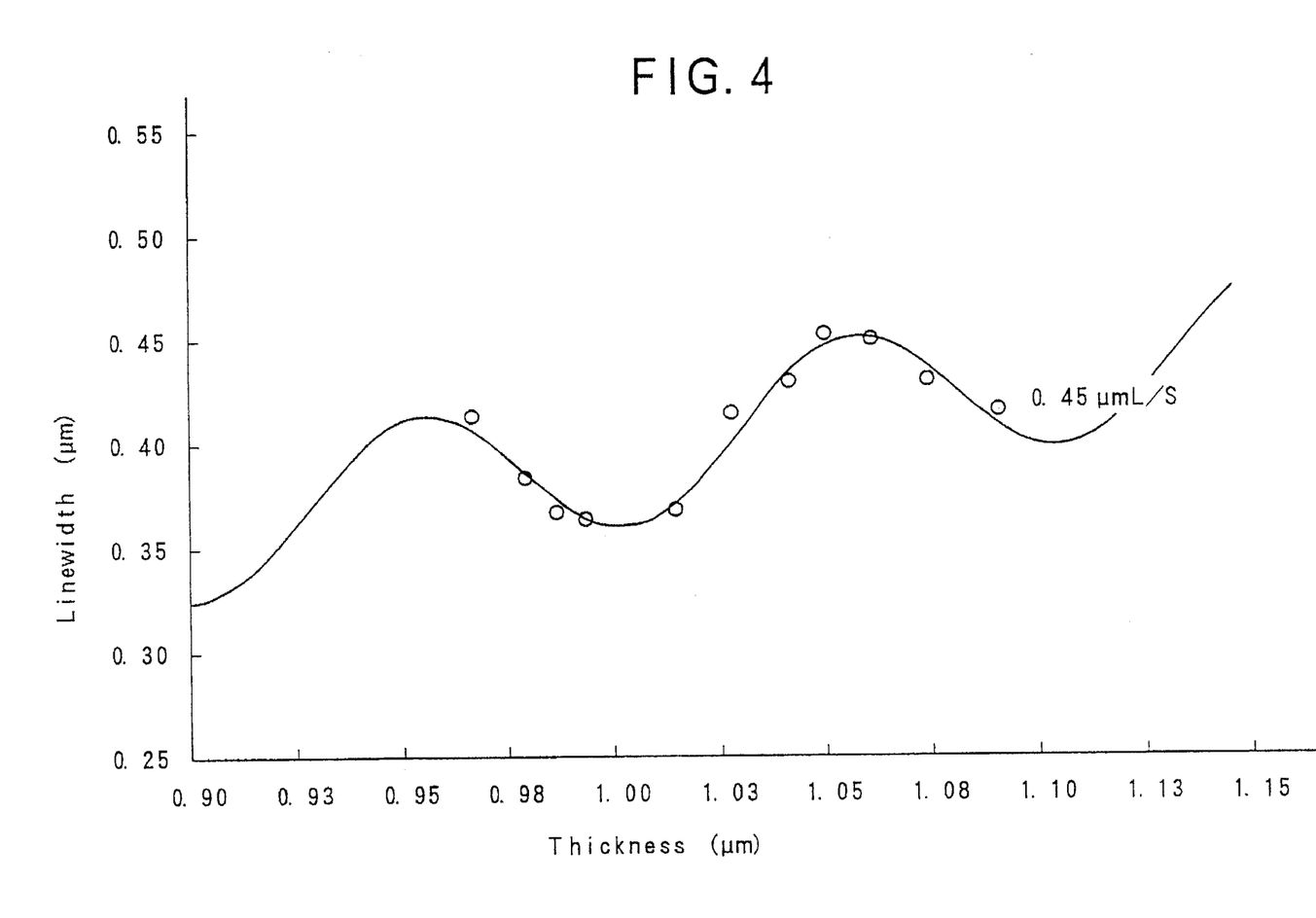
FIG. 4 is a graph showing the relationship between the thickness of the photoresist films prepared in Example 3 without using the liquid coating compositions of the invention, i.e., without forming an anti-interference film.

In another run, the procedure of Example 3 was repeated except that none of the liquid coating compositions of the invention were used (i.e., anti-interference films were not formed). The linewidth (0.45 μm) of the resist patterns formed was measured as relative to the thickness of the photoresist films. The results are shown in the FIG. 4 graph by plotting the variations in the linewidth of the pattern on the y-axis while plotting the resist film thickness on the x-axis. Obviously, the maximum dimensional variation that occurred increased to 0.071 μm.

As described in detail on the foregoing pages, the invention provides liquid coating compositions for use in forming photoresist coating films that are also capable of protecting applicators and related equipment against corrosion. The invention also provided liquid coating compositions that are capable of forming anti-interference films of uniform thickness without unevenness in application and which help produce resist patterns in good registry with mask patterns. The invention further provides photoresist materials using said liquid coating compositions. The coating films in the resist materials are highly effective in lessening the multiple-interference effect of light in photolithography and, hence, they contribute to the formation of photoresist patterns with high dimensional precision. What is worth particular mention is that since said coating films are capable of fully meeting the recent demand for smaller features sizes in the fabrication of semiconductor devices, they are effective in preventing the drop in the dimensional precision of very fine resist patterns which have not been completely protected by the conventional antireflective films.

What is claimed is:

1. In a liquid coating composition for use in forming a photoresist coating film comprising a water-soluble, film-forming component and a fluorosurfactant, the improvement wherein said fluorosurfactant is at least one member selected from the group consisting of the salt of a compound represented by the following general formula (I):

$$RfCOOH \qquad (I)$$

(where Rf is a fluorohydrocarbon group having part or all of the hydrogen atoms in a $C_2$–$C_{20}$ saturated or unsaturated hydrocarbon group replaced by fluorine atoms) with an alkanolamine and the salt of a compound represented by the following general formula (II):

$$R'fSO_3H \qquad (II)$$

(where R'f is a fluorohydrocarbon group having part or all of the hydrogen atoms in a $C_2$–$C_{20}$ saturated or unsaturated hydrocarbon group replaced by fluorine atoms) with an alkanolamine.

2. A liquid coating composition according to claim 1 wherein the compound represented by the general formula (I) is either perfluoroheptanoic acid or perfluorooctanoic acid or both.

3. A liquid coating composition according to claim 1 wherein the compound represented by the general formula (II) is at least one member selected from the group consisting of perfluoropropylsulfonic acid, perfluorooctylsulfonic acid and perfluorodecylsulfonic acid.

4. A liquid coating composition according to claim 1 wherein said alkanolamine is at least one member selected from the group consisting of monoethanolamine, N-methylethanolamine, N-ethylethanolamine, diethanolamine and triethanolamine.

5. In a liquid coating composition for use in forming a photoresist coating film comprising a water-soluble, film-forming component and a fluorosurfactant, the improvement wherein the composition further contains at least one anionic surfactant represented by the following general formula (III):

(where $R_1$ is an alkyl group having 5 to 18 carbon atoms; $R_2$ is a hydrogen atom or an alkyl or alkoxy group having 5 to 18 carbon atoms; $R_3$ is an N-substituted or unsubstituted ammonium sulfonate group of the general formula $$-SO_3NZ_4,$$

each Z being, independently from the others, a hydrogen atom, alkyl group having 1 to 2 carbon atoms or hydroxyalkyl group having 1 to 2 carbon atoms; and $R_4$ and $R_5$ are each a hydrogen atom or an N-substituted or unsubstituted ammonium sulfonate group of the general formula $-SO_3NZ_4$, Z having the same meaning as defined above).

6. A liquid coating composition according to claim 5 wherein $R_1$, is an alkyl group having 5 to 18 carbon atoms; $R_2$ is a hydrogen atom; $R_3$ and $R_4$ are each a group of $-SO_3NH_4$; and $R_5$ is a hydrogen atom in the general formula (III).

7. A liquid coating composition according to claim 5 wherein said fluorosurfactant is either a fluorine atom containing compound represented by the following general formula (IV):

$$RfCOOM_1 \qquad (IV)$$

or a fluorine atom containing compound represented by the following general formula (V):

$$R'fSO_3M_2 \qquad (V)$$

or both.

8. A liquid coating composition according to claim 7 wherein the fluorine atom containing compound represented by the general formula (IV) is the salt of a compound represented by the following general formula (I):

$$RfCOOH \qquad (I)$$

(where Rf is a fluorohydrocarbon group having part or all of the hydrogen atoms in a $C_2$–$C_{20}$ saturated or unsaturated hydrocarbon group replaced by fluorine atoms) with an alkanolamine.

9. A liquid coating composition according to claim 8 wherein the compound represented by the general formula (I) is either perfluoroheptanoic acid or perfluorooctanoic acid or both.

10. A liquid coating composition according to claim 7 wherein the fluorine atom containing compound represented by the general formula (V) is the salt of a compound represented by the following general formula (II):

$$R'fSO_3H \qquad (II)$$

(where R'f is a fluorohydrocarbon group having part or all of the hydrogen atoms in a $C_2$–$C_{20}$ saturated or unsaturated hydrocarbon group replaced by fluorine atoms) with an alkanolamine.

11. A liquid coating composition according to claim 10 wherein the compound represented by the general formula (II) is at least one member selected from the group consisting of perfluoropropylsulfonic acid, perfluorooctylsulfonic acid and perfluorodecylsulfonic acid.

12. In a liquid coating composition for use in forming a photoresist coating film comprising a water-soluble, film-forming component and a fluorosurfactant, the improvement wherein the composition further comprises at least one anionic surfactant represented by the following general formula (III):

(where $R_1$ is an alkyl or alkoxy group having 5 to 18 carbon atoms; $R_2$ is a hydrogen atom or an alkyl or alkoxy group having 5 to 18 carbon atoms; $R_3$ is an N-substituted or unsubstituted ammonium sulfonate group of the general formula $$-SO_3NZ_4,$$

each Z being, independently from the others, a hydrogen atom, alkyl group having 1 to 2 carbon atoms or hydroxyalkyl group having 1 to 2 carbon atoms; and $R_4$ and $R_5$ are each a hydrogen atom or an N-substituted or unsubstituted ammonium sulfonate group of the general formula $-SO_3NZ_4$, Z having the same meaning as defined above) and an N-alkyl-2-pyrrolidone represented by the following general formula (VI):

(where $R_{10}$ is a $C_6$–$C_{20}$ alkyl group).

13. A liquid coating composition according to claim 12 wherein the N-alkyl-2-pyrrolidone represented by the general formula (VI) is N-octyl-2-pyrrolidone or N-dodecyl-2-pyrrolidone.

14. A liquid coating composition according to claim 12 wherein said fluorosurfactant is either a fluorine atom containing compound represented by the following general formula (IV):

$$RfCOOM_1 \qquad (IV)$$

or a fluorine atom containing compound represented by the following general formula (V):

$$R'fSO_3M_2 \qquad (V)$$

or both.

15. A liquid coating composition according to claim 14 wherein the fluorine atom containing compound represented by the general formula (IV) is the salt of a compound represented by the following general formula (I):

$$RfCOO \qquad (I)$$

(where Rf is a fluorohydrocarbon group having part or all of the hydrogen atoms in a $C_2$–$C_{20}$ saturated or unsaturated hydrocarbon group replaced by fluorine atoms) with an alkanolamine.

16. A liquid coating composition according to claim 15 wherein the compound represented by the general formula (I) is either perfluoroheptanoic acid or perfluorooctanoic acid or both.

17. A liquid coating composition according to claim 14 wherein the fluorine atom containing compound represented by the general formula (V) is the salt of a compound represented by the following general formula (II):

$$R'fSO_3H \qquad (II)$$

(where R'f is a fluorohydrocarbon group having part or all of the hydrogen atoms in a $C_2$–$C_{20}$ saturated or unsaturated hydrocarbon group replaced by fluorine atoms) with an alkanolamine.

18. A liquid coating composition according to claim 17 wherein the compound represented by the general formula (II) is at least one member of the group consisting of perfluoropropylsulfonic acid, perfluorooctylsulfonic acid and perfluorodecylsulfonic acid.

* * * * *

UNITED STATES PATENT AND TRADEMARK OFFICE
CERTIFICATE OF CORRECTION

PATENT NO. : 5,631,314
DATED : May 20, 1997
INVENTOR(S) : KAZUMASA WAKIYA, MASAKAZU KOBAYASHI, TOSHIMASA NAKAYAMA

It is certified that error appears in the above-identified patent and that said Letters Patent is hereby corrected as shown below:

Column 15, after the formula appearing at line 29, insert the following:

—[where Rf is a fluorohydrocarbon group having part or all of the hydrogen atoms in a $C_2 - C_{20}$ saturated or unsaturated hydrocarbon group replaced by fluorine atoms; $M_1$ is a hydrogen atom or $NR_6R_7R_8R_9$ (where $R_6$, $R_7$, $R_8$ and $R_9$ are each independently a hydrogen atom or a lower alkyl group having 1 to 4 carbon atoms optionally having a hydroxyl group)]—;

after the formula appearing at line 33, insert the following:

—[where R'f is a fluorohydrocarbon group having part or all of the hydrogen atoms in a $C_2 - C_{20}$ saturated or unsaturated hydrocarbon group replaced by fluorine atoms; $M_2$ is a hydrogen atom or $NR_6R_7R_8R_9$ (where $R_6$, $R_7$, $R_8$ and $R_9$ are each independently a hydrogen atom or a lower alkyl group having 1 to 4 carbon atoms optionally having a hydroxyl group)]—.

UNITED STATES PATENT AND TRADEMARK OFFICE
CERTIFICATE OF CORRECTION

PATENT NO. : 5,631,314
DATED : May 20, 1997
INVENTOR(S) : KAZUMASA WAKIYA, MASAKAZU KOBAYASHI, TOSHIMASA NAKAYAMA

It is certified that error appears in the above-identified patent and that said Letters Patent is hereby corrected as shown below:

Column 16, after the formula appearing at line 41, insert the following:

—[where Rf is a fluorohydrocarbon group having part or all of the hydrogen atoms in a $C_2 - C_{20}$ saturated or unsaturated hydrocarbon group replaced by fluorine atoms; $M_1$ is a hydrogen atom or $NR_6R_7R_8R_9$ (where $R_6$, $R_7$, $R_8$ and $R_9$ are each independently a hydrogen atom or a lower alkyl group having 1 to 4 carbon atoms optionally having a hydroxyl group)]—;

after the formula appearing at line 45, insert the following:

—[where R'f is a fluorohydrocarbon group having part or all of the hydrogen atoms in a $C_2 - C_{20}$ saturated or unsaturated hydrocarbon group replaced by fluorine atoms; $M_2$ is a hydrogen atom or $NR_6R_7R_8R_9$ (where $R_6$, $R_7$, $R_8$ and $R_9$ are each independently a hydrogen atom or a lower alkyl group having 1 to 4 carbon atoms optionally having a hydroxyl group)]—.

UNITED STATES PATENT AND TRADEMARK OFFICE
CERTIFICATE OF CORRECTION

PATENT NO. : 5,631,314
DATED : May 20, 1997
INVENTOR(S) : KAZUMASA WAKIYA, MASAKAZU KOBAYASHI, TOSHIMASA NAKAYAMA

It is certified that error appears in the above-identified patent and that said Letters Patent is hereby corrected as shown below:

Column 16, correct the formula appearing at line 53 to read as follows:

— RfCOOH —.

Signed and Sealed this

Thirteenth Day of January, 1998

Attest:

BRUCE LEHMAN

Attesting Officer     *Commissioner of Patents and Trademarks*